(12) United States Patent
Adkisson et al.

(10) Patent No.: US 7,217,968 B2
(45) Date of Patent: May 15, 2007

(54) RECESSED GATE FOR AN IMAGE SENSOR

(75) Inventors: James W. Adkisson, Jericho, VT (US); John Ellis-Monaghan, Grand Isle, VT (US); Mark D. Jaffe, Shelburne, VT (US); Jerome B. Lasky, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,097

(22) Filed: Dec. 15, 2004

(65) Prior Publication Data

US 2006/0124976 A1 Jun. 15, 2006

(51) Int. Cl.
*H01L 31/062* (2006.01)

(52) U.S. Cl. ............... 257/292; 257/233; 257/290; 257/291; 257/232; 257/258; 257/462

(58) Field of Classification Search .......... 257/316, 257/291, 292, 72; 438/592
See application file for complete search history.

(56) References Cited

U.S. PATENT DOCUMENTS

| 4,173,765 | A | | 11/1979 | Heald et al. | |
|---|---|---|---|---|---|
| 4,760,273 | A | | 7/1988 | Kimata | |
| 4,814,839 | A | * | 3/1989 | Nishizawa et al. | 257/329 |
| 5,412,227 | A | * | 5/1995 | Zommer | 257/133 |
| 5,503,017 | A | * | 4/1996 | Mizukoshi | 73/514.36 |
| 5,811,336 | A | * | 9/1998 | Kasai | 438/271 |
| 6,027,955 | A | | 2/2000 | Lee et al. | |
| 6,127,697 | A | | 10/2000 | Guidash | |
| 6,278,142 | B1 | * | 8/2001 | Hynecek | 257/247 |
| 6,303,448 | B1 | * | 10/2001 | Chang et al. | 438/300 |
| 6,465,820 | B1 | | 10/2002 | Fox | |
| 6,531,380 | B2 | * | 3/2003 | Li et al. | 438/579 |
| 6,713,796 | B1 | | 3/2004 | Fox | |
| 6,815,297 | B1 | * | 11/2004 | Krivokapic et al. | 438/287 |
| 2002/0088991 | A1 | * | 7/2002 | Hisamoto | 257/172 |
| 2003/0075719 | A1 | * | 4/2003 | Sriram | 257/77 |
| 2003/0089929 | A1 | | 5/2003 | Rhodes | |

(Continued)

FOREIGN PATENT DOCUMENTS

GB 890993 A2 * 1/1999

*Primary Examiner*—Zandra V. Smith
*Assistant Examiner*—Tsz Kit Chiu
(74) *Attorney, Agent, or Firm*—Scully, Scott, Murphy & Presser, P.C.; Anthony J. Canale

(57) ABSTRACT

A novel image sensor cell structure and method of manufacture. The imaging sensor comprises a substrate, a gate comprising a dielectric layer and gate conductor formed on the dielectric layer, a collection well layer of a first conductivity type formed below a surface of the substrate adjacent a first side of the gate conductor, a pinning layer of a second conductivity type formed atop the collection well at the substrate surface, and a diffusion region of a first conductivity type formed adjacent a second side of the gate conductor, the gate conductor forming a channel region between the collection well layer and the diffusion region. Part of the gate conductor bottom is recessed below the surface of the substrate. Preferably, a portion of the gate conductor is recessed at or below a bottom surface of the pinning layer to a depth such that the collection well intersects the channel region.

20 Claims, 6 Drawing Sheets

U.S. PATENT DOCUMENTS

| | | |
|---|---|---|
| 2003/0107066 A1 | 6/2003 | Stevenson et al. |
| 2004/0000688 A1* | 1/2004 | Harari et al. ............... 257/315 |
| 2004/0262609 A1* | 12/2004 | Mouli et al. ................. 257/72 |
| 2005/0042793 A1 | 2/2005 | Mouli et al. |

* cited by examiner

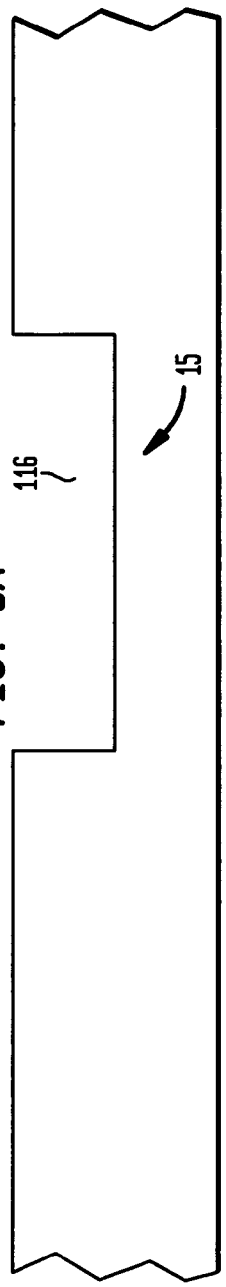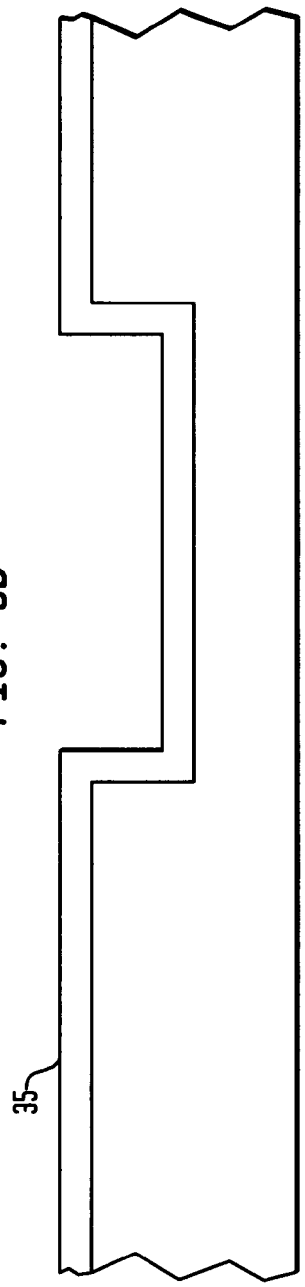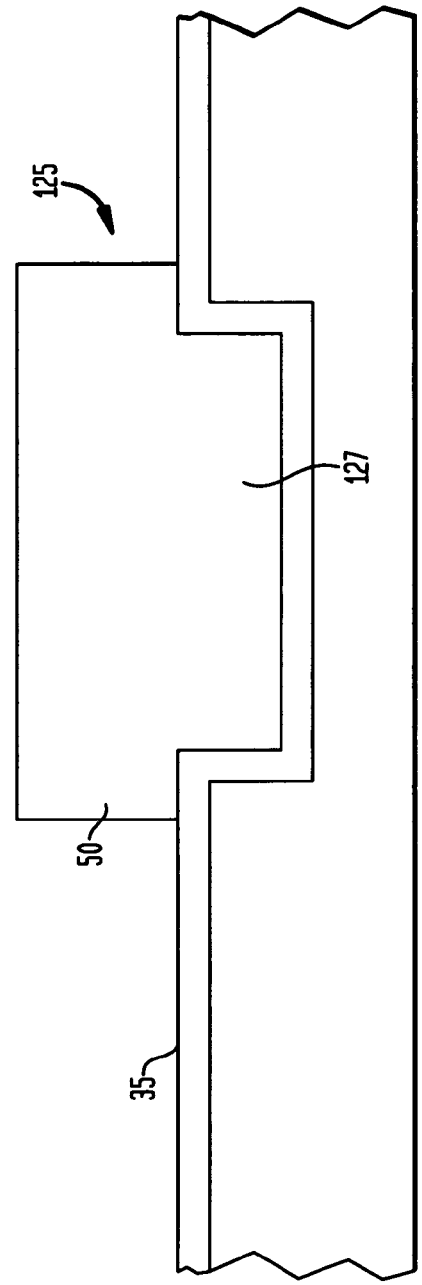

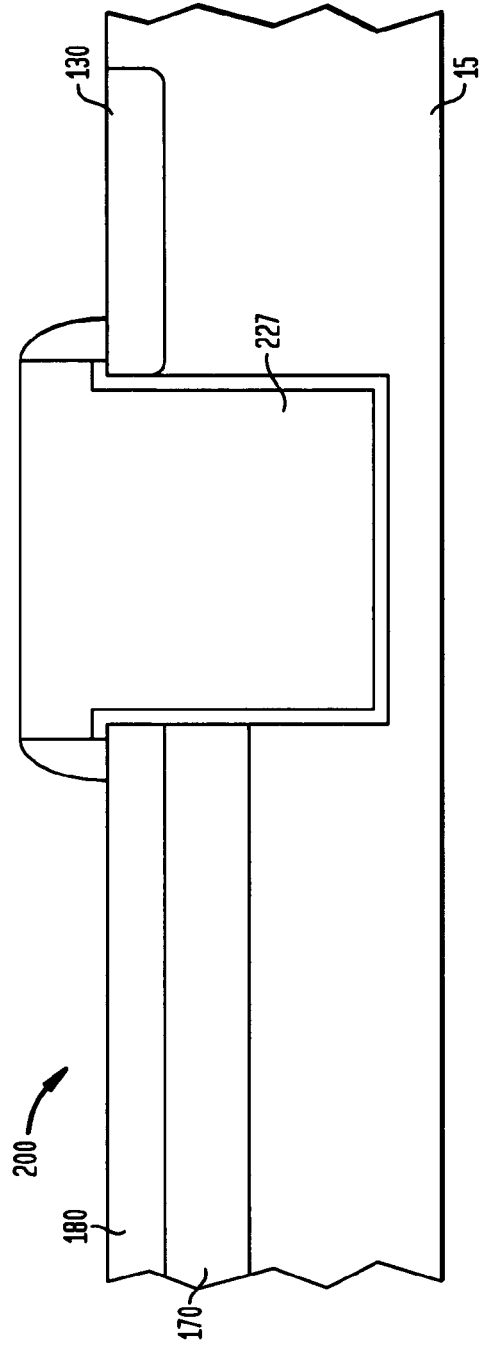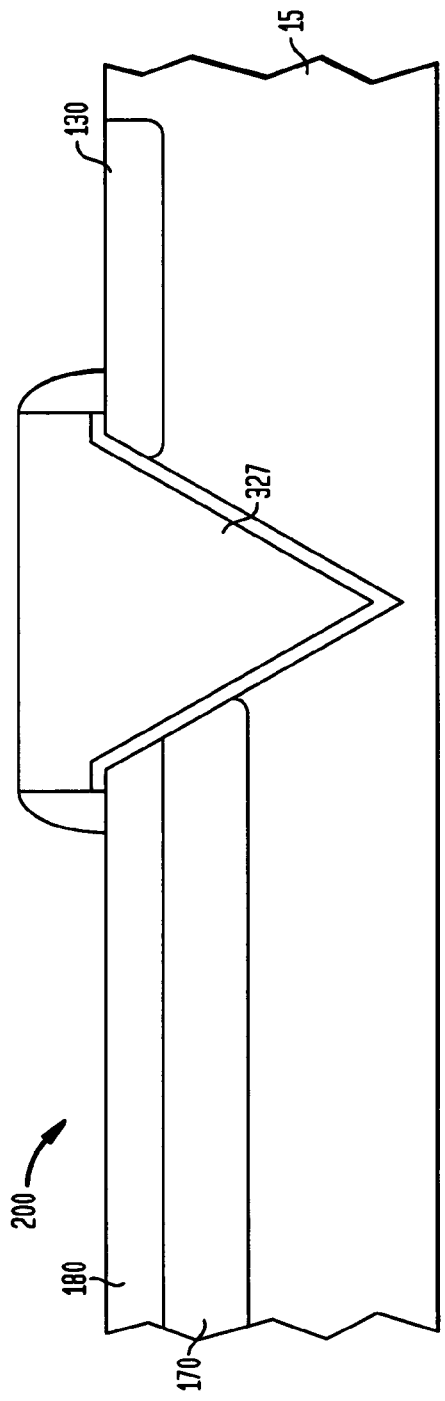

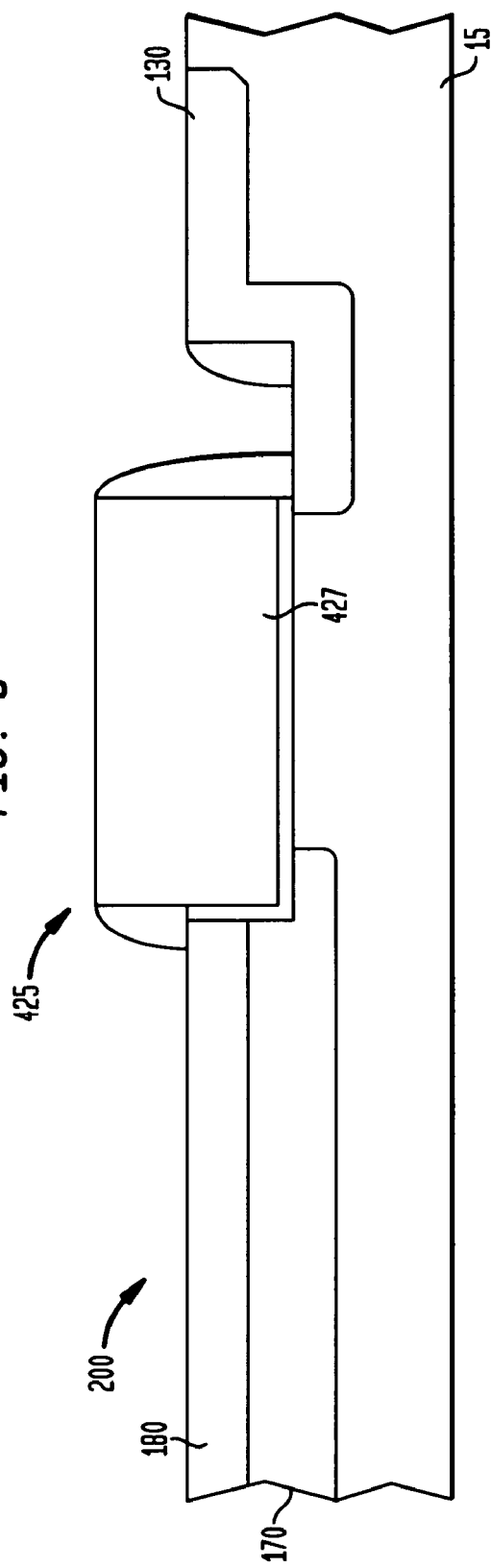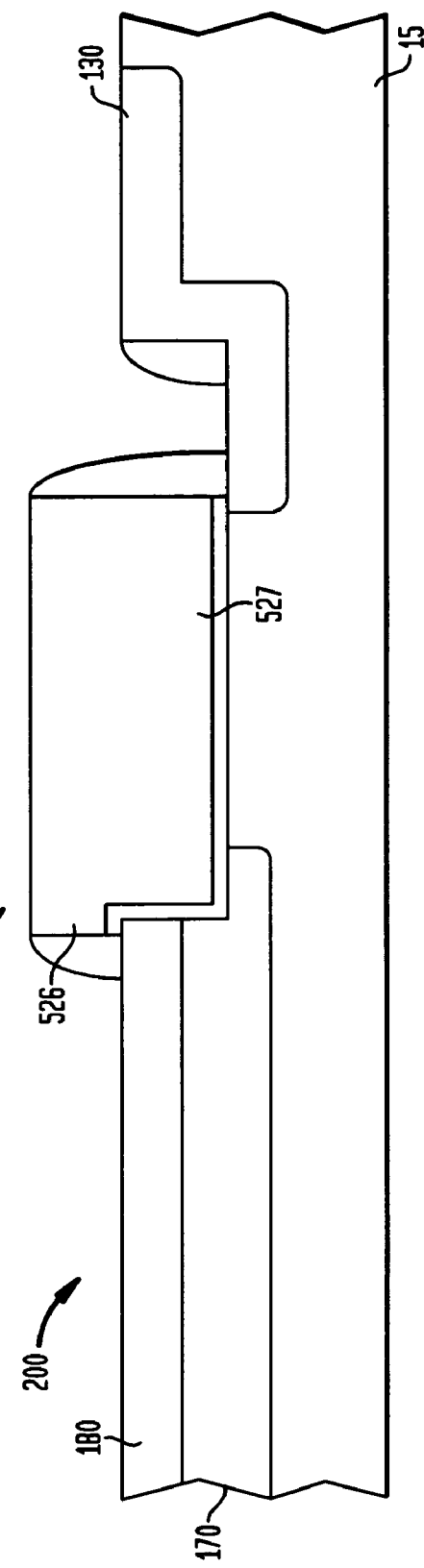

RECESSED GATE FOR AN IMAGE SENSOR

FIELD OF THE INVENTION

The present invention related generally to the fabrication of semiconductor pixel imager arrays, and more particularly, to a novel Active Pixel Sensor (APS) cell structure including a novel transfer gate and process therefore.

BACKGROUND OF THE INVENTION

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photo gate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

As shown in FIG. 1, a typical CMOS APS cell 10 includes a pinned photodiode 20 having a pinning layer 18 doped p-type and, an underlying lightly doped n-type region 17. Typically, the pinned diode 20 is formed on top of a p-type substrate 15 or a p-type epitaxial layer or p-well surface layer having a lower p-type concentration than the diode pinning layer 18. The n-region 17 and p region 18 of the photodiode 20 are typically spaced between an isolation region (not shown) and a charge transfer transistor gate 25 which are surrounded by thin spacer structures 23a,b. The photodiode 20 thus has two p-type regions 18 and 15 having a same potential so that the n− region 17 is fully depleted at a pinning voltage (Vp). The pinned photodiode is termed "pinned" because the potential in the photodiode is pinned to a constant value, Vp, when the photodiode is fully depleted. In operation, light coming from the pixel is focused down onto the photodiode through the diode where electrons collect at the n-type region 17. When the transfer gate 25 is operated, i.e., turned on, the photo-generated charge 24 is transferred from the charge accumulating doped n− type region 17 via a transfer device surface channel 16 to a floating diffusion region 30 which is doped n+ type.

A first problem with these current CMOS Imaging cells with a charge transfer gate 25 (e.g., a "4" Transistor cell) is the definitional problem of controlling the readout of the charge. The p type surface pinning layer 18 is necessary for low dark current, but can create a potential barrier between the n-type charge collection well 17 and the transfer device channel 16. The structure as currently practiced by the industry is also very sensitive to normal manufacturing process variations. Overlay and image size variation of the block masks is critical for cell operation.

For example, in conventional processes for fabricating the pinning layer 18 over the photodiode in the prior art APS cell 10 shown in FIG. 1, it is the case that some amount of p doping 29 overlaps onto the transfer gate 25 which is normally formed of intrinsic polysilicon or low level p-type doped 27. This is a result of mask overlay tolerance or displacement of the mask edge during fabrication. Subsequently, during formation of the n+ type doped floating diffusion region 30, the gate is processed to include a n+ type doped region 28. The presence of this p doping has an effect of reducing the efficiency and dynamic range of the gate, particularly by causing variations in transfer gate voltage thresholds ($V_t$). This will cause the transfer gate to not turn on completely. Also, because of lithographic alignment issues, the position of the p 'overlap' onto the gate varies, leading to performance variability.

A second problem is that the transfer gate structure 25 as defined takes up a lot of space in the cell leading to lower cell fill factor (the percentage of the cell that functions as a light collection area). One of the reasons for this is that there are multiple block levels whose overlay and image size goes into the minimum transfer gate length. If the n+ type floating diffusion region 30 is implanted on the collection side of the transfer gate, it will create excess leakage. If the p type surface pinning layer is implanted on the drain side of the gate, it will create a series resistance for the device. Both of these layers must abut the transfer gate on one side. The n-type charge collection layer 17 must somewhat overlap the gate or there will be a large potential barrier to charge transfer, but if it overlaps too much, the device will suffer from short channel effects.

Variation in the concentration distribution of the impurity dopant in the n-type collection well region 17, along with alignment, may cause both variation in the properties of the photodiode as well as create a potential barrier to occur immediately under the gate electrode. This effects the charge transfer efficiency of the transfer MOS transistor which in turn may degrade performance of the CMOS image sensor. Prior art teaches the use of oblique-rotating implantation or the use of excessive thermal diffusion to position or move the dopant under the gate structure 25 to minimize the potential barrier. U.S. Pat. No. 6,660,553 describes a method whereby an implant mask is used to form a photodiode which is partly situated under the gate.

Structures and methods that minimize the potential barrier and the parametric variability of the transfer gate are of great value for CMOS sensors.

It would thus be highly desirable to provide a novel image sensor APS cell structure and method of manufacture whereby the transfer gate is recessed such that the charge collection well intersects the bottom of the transfer gate channel.

SUMMARY OF THE INVENTION

This invention addresses a novel image sensor APS cell structure and method of manufacture. Particularly, an image sensor APS cell having a recessed transfer gate is fabricated such that the charge collection well intersects the bottom of the transfer gate channel.

According to the embodiment of the invention, the image sensor APS cell structure includes a doped p pinning layer and an N+ doped gate. There is additionally provided a method of forming the CMOS image sensor APS cell having a transfer gate that is recessed such that the transfer channel intersects the collection well. This improves the control of the readout of the charge of the imaging cell as the pinning layer no longer has the ability to produce a potential barrier to charge transfer. By recessing the transfer gate, not only is the pinning layer out of the way of charge transfer, but now the transfer device characteristics are not sensitive to the alignment overlay of the block levels.

According to a first aspect of the invention, there is provided an optical imaging sensor comprising: a substrate having an upper surface; a gate conductor having at least a portion recessed below the upper substrate surface; a collection well region formed adjacent a first side of the gate conductor and a diffusion region formed adjacent a second side of the gate conductor. The imaging sensor further comprises a pinning layer formed on an upper surface of the collection well. At least one portion of the gate conductor is recessed below the pinning layer. Moreover, the imaging sensor collection well intersects a channel region formed by the gate conductor. Recessing the transfer gate relieves the problem as the surface pinning layer no longer produces a potential barrier to charge transfer. By recessing the transfer gate, not only is the pinning layer out of the way of charge transfer, but now the transfer device characteristics are not sensitive to the alignment overlay of the block levels.

According to a second aspect of the invention, there is provided a method for fabricating an active pixel sensor (APS) cell structure comprising the steps of: etching a trench into a semiconductor substrate to define a recessed portion of an image cell transfer gate below a substrate surface; forming a layer of dielectric material over the semiconductor substrate and including the recessed portion; filling the recessed portion with polysilicon material atop the dielectric material layer and forming a polysilicon gate layer above the substrate surface; etching the polysilicon gate layer to define a portion of the image cell transfer gate above the substrate surface; forming a doped pinning layer comprising material of a first conductivity type in the substrate at a first side of the transfer gate; forming a doped collection well layer comprising material of a second conductivity type beneath the doped pinning layer; and, forming a doped diffusion layer of a second conductivity type in the substrate adjacent another side of the transfer gate, the recessed portion of the image cell transfer gate forming a channel region enabling charge transfer between the collection well layer and the diffusion region, wherein the recessed portion of the image cell transfer gate extends to a depth below the pinning layer. Preferably, the recessed portion of the image cell transfer gate extends to a depth below the formed doped collection well layer such that the doped collection well layer intersects the channel region to thereby eliminate any potential barrier interference to charge transfer caused by the formed pinning layer.

Advantageously, the design of the recessed transfer gate allows the design of a much smaller cell, or at least a cell with smaller transfer gate area and thus higher fill factor.

BRIEF DESCRIPTION OF THE DRAWINGS

The objects, features and advantages of the present invention will become apparent to one skilled in the art, in view of the following detailed description taken in combination with the attached drawings, in which:

FIGS. 3(a)–3(c) depict, through cross-sectional views, the process steps for forming the APS cell 100 of the present invention and resulting in the structure shown in FIG. 2;

FIG. 4 depicts, through a cross-sectional view, a transfer gate fabricated to include a recessed portion etched significantly deeper than the transfer gate etch depth according to the first embodiment (see FIG. 2);

FIG. 5 depicts, through a cross-sectional view, a transfer gate fabricated to include a "V" shaped recessed portion;

FIG. 6 depicts, through a cross-sectional view, a transfer gate fabricated to include an upper gate portion that is equal in width or narrower than the recessed trench portion;

FIG. 7 depicts, through a cross-sectional view, a transfer gate fabricated that includes an extended gate portion above the substrate surface that overlaps the recess on the photodiode collection side; and, FIG. 8 illustrates, through a cross-sectional view, a transfer gate fabricated to have having a smaller width than the previous embodiments, and, as deep a recessed gate portion as the technology permits.

DETAILED DESCRIPTION OF THE PREFERRED EMBODIMENTS

Figure 1:
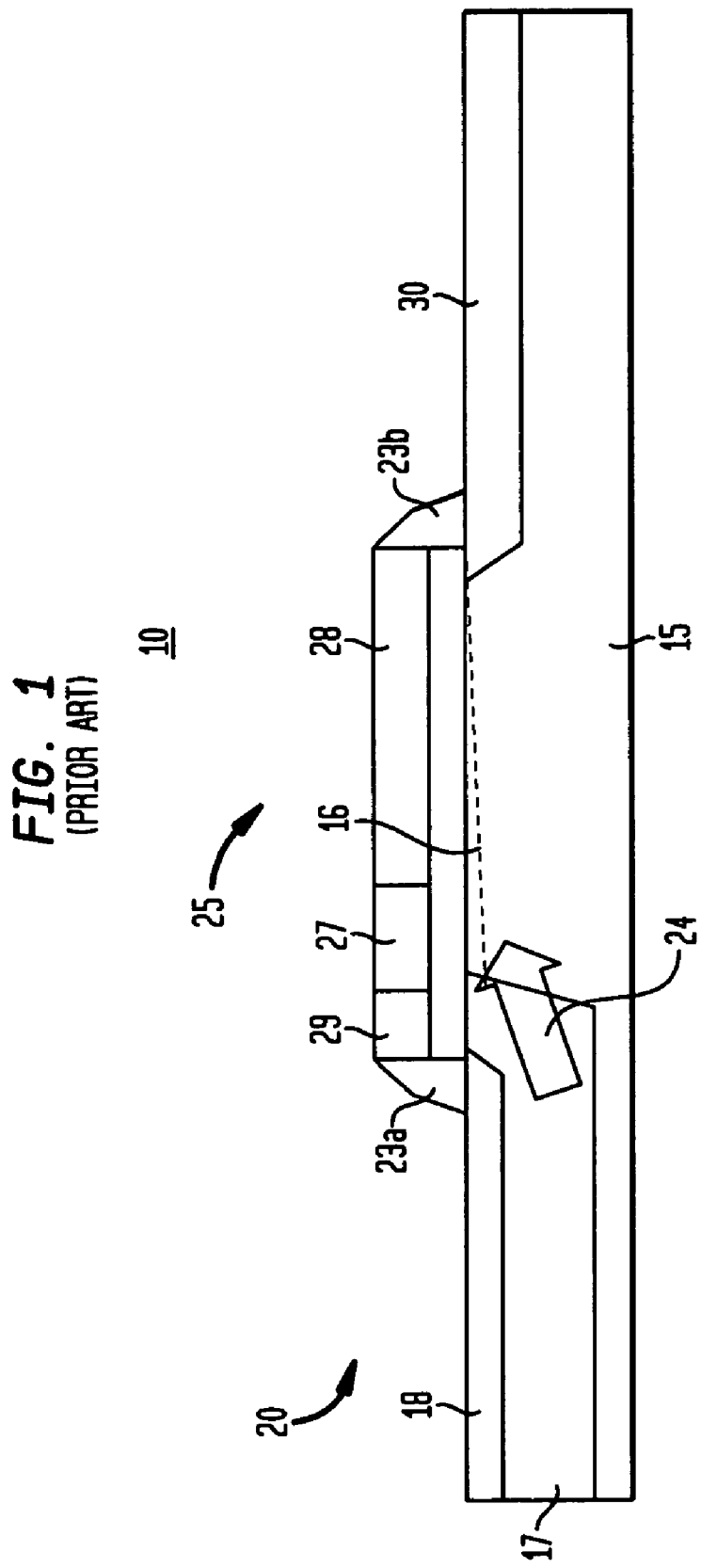
FIG. 1 depicts an image sensor pixel array 10 according to the prior art.
Figure 2:
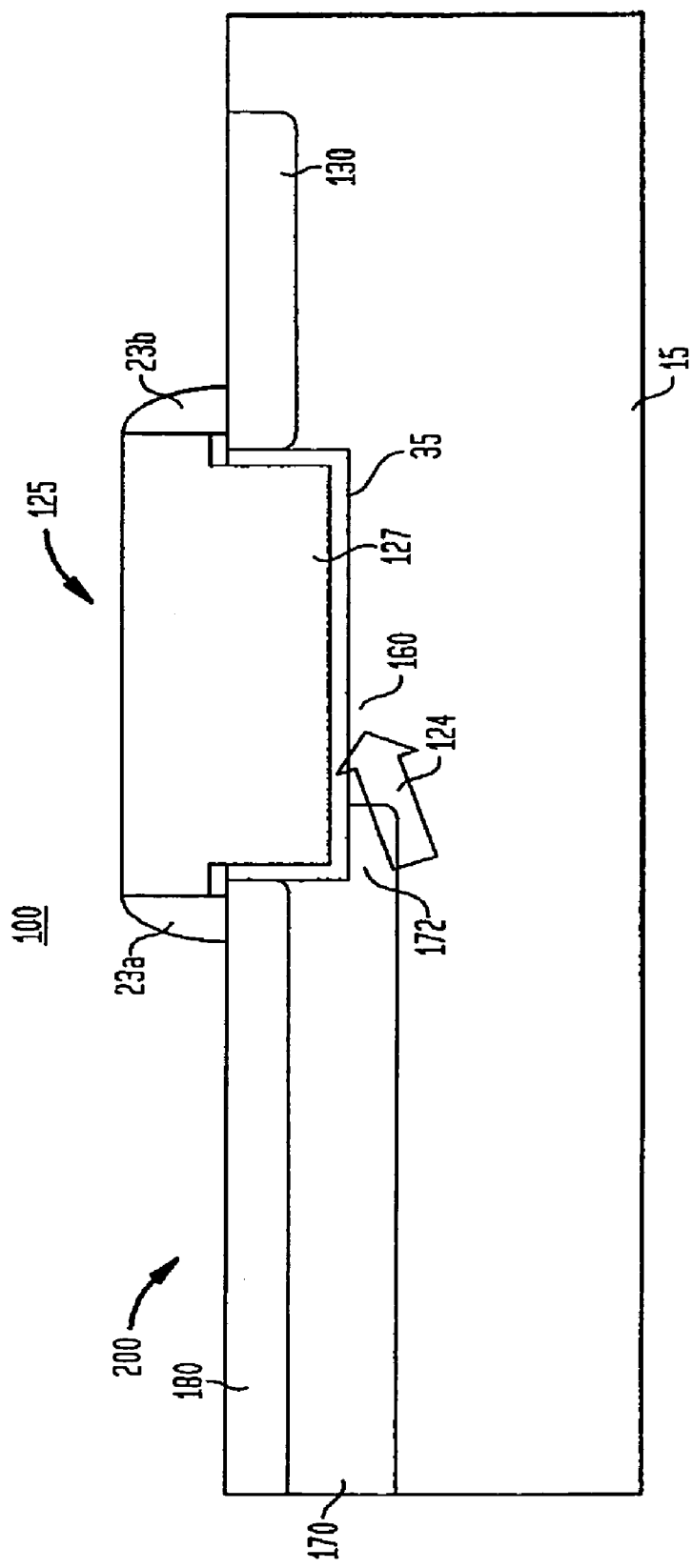
FIG. 2 illustrates the image sensor APS cell 100 of the present invention.

FIG. 2 illustrates the image sensor APS cell 100 of the present invention. As shown in FIG. 2, the APS cell 100 includes a transfer gate 125 formed on top of a gate dielectric material layer 35 which is formed on top of a semiconductor substrate 15 having a recessed portion 127 formed below the substrate surface. Abutting one side of the transfer gate is a photodiode 200 comprising a surface pinning layer 180 doped with material of a first conductivity, e.g., p type material dopant, and an charge collection well 170 doped with material of a second conductivity, e.g., n type material dopant, formed directly underneath the pinning layer.

Abutting the other side of the transfer gate is a gate diffusion region 130 comprising doped with material of a second conductivity, e.g., n type material dopant. As shown in FIG. 2, the transfer gate channel 160 formed underneath the transfer gate 125 intersects a portion 172 of the subsequently formed abutting charge collection well region 170. The recessed transfer gate 125 helps overcome the limitations of the prior art APS cell structure as the surface pinning layer 180 no longer has the ability to produce a potential barrier to charge transfer. By recessing the transfer gate, the pinning layer 180 does not affect charge transfer as it no longer intersects the path 124 of charge transfer, but additionally renders the transfer device characteristics not sensitive to the alignment overlay of the block levels. The charge collection well 170 is thus formed to intersect the bottom of the transfer gate channel 160. Thus, there is no potential barrier interference from the pinning layer 180.

The method to create a recessed transfer gate 125 is now described. As shown in FIG. 3(a), there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, e.g., $1\times10^{14}$ to $1\times10^{16}$ cm$^{-3}$. Next, using standard processing techniques, a trench recess is formed in the substrate. That is, utilizing a trench lithography, a photoresist mask (not shown) is applied, patterned and developed to expose an open region for forming a trench etch. Subsequently, an etch process is performed through the opening in the mask to form a trench recess 116 that extends down below the substrate surface to a depth of about 0.1 lm to 1 lm or, at least to a depth such that a subsequently formed collection well intersects the bottom of the channel region so that potential barrier interference from the pinning layer is eliminated. Preferably, the trench recess 116 formed according to this process has a width less than about the typical 0.4–0.9 lm transfer gate features present in 0.18 micron technology node processing.

Subsequent to the formation of the trench 116, a dielectric material layer 35 is formed by standard deposition or growth techniques atop the substrate 15 that will form the eventual transfer gate dielectric. The dielectric layer is typically formed to a thickness ranging between 35 Å to 100 Å and may comprise suitable gate dielectric materials including but not limited to: an oxide (e.g., $SiO_2$), a nitride (e.g., silicon nitride) an oxynitride (e.g., Si oxynitride), $N_2O$, NO, $ZrO_2$, or other like materials. The dielectric layer 35 is formed on the surface of the Si-containing semiconductor substrate 15 and on the sidewalls and bottom surface of trench 116 using conventional thermal oxidation or by a suitable deposition process such as chemical vapor deposition, plasma-assisted chemical vapor deposition, evaporation, sputtering and other like deposition processes. Although it is not shown, it is understood that the dielectric layer may comprise a stack of dielectric materials.

Next, a gate layer 50, is deposited to fill the trench 116 and form a layer above the gate dielectric layer 35 using conventional deposition processes including, but not limited to: CVD, plasma-assisted CVD, sputtering, plating, evaporation and other like deposition processes (e.g., a low pressure CVD). This layer may be comprised of any conductor including metals, silicides, or polysilicon. For purposes of description, an intrinsic polysilicon layer is used. The intrinsic polysilicon layer structure formed atop the dielectric layer surface to a thickness ranging between about 1 k Å to 2 k Å however, may be outside this range. It is understood that for proper operation polysilicon gate, layer 50, must be doped with the second conductivity type, e.g. n-type, to a concentration in the range of $1\times10^{18}$ cm$^{-3}$ to $1\times10^{19}$ cm$^{-3}$. This may be accomplished by the standard practice of utilizing the source/drain implants or by predoping the polysilicon before etch, or by using insitu doped polysilicon.

Regardless of whether or not the formed gate polysilicon layer 50 is doped, e.g., subsequently by ion implantation or, in-situ doped and deposited, the transfer gate is then formed to result in the structure shown in FIG. 3(c), whereby a photo lithographic process is used to define the gate region. This step is not illustrated since there are many different ways how the lateral size and shape of the gate can be defined. Typically, an etch window is provided in a resist mask (not shown), and one or more etch processes are performed, e.g., a reactive ion etch process, that is optimized to ensure proper etching of the doped polysilicon layer 50 and dielectric layer 35 or dielectric layer stack. Chemical Mechanical Polish techniques can also be used to define the gate, and may be the preferred method when using metal gates. The resulting structure of the transfer gate 125 polysilicon layer 50 is shown in FIG. 2 which illustrates the width of the formed transfer gate poly region above the substrate surface to be slightly wider than the width of the trench portion 127 of the transfer gate trench.

In a further step (not shown), gate sidewall spacers 23a,b are formed at either side of the transfer gate by conventional deposition processes well known in the art, and may comprise any conventional oxide or nitride (e.g., $Si_3N_4$) or oxide/nitride and then they are etched by RIE or another like etch process. The thickness of spacers 23a,b may vary, but typically they have a thickness of from about 10 nm to about 150 nm. The photodiode pinning region is typically created after forming spacers in a further step (not shown). It may also be created at other points in the process. This step comprises applying a photoresist layer patterning, and etching an ion implantation mask according to techniques known in the art to form a mask edge approximately coincident with the gate edge or as close as possible given alignment tolerances, to provide an opening to an area between an edge of the gate and a formed isolation region, e.g., STI region (not shown), where the charge accumulation region of the photodiode is to be formed. This opening permits the implantation of ions of p-type dopant material such as boron at a concentration sufficient to form the p-type dopant regions as shown in FIG. 2 up to the edge of the spacer 23a. The active p-type dopant material is ion implanted at dosing concentrations ranging between $1\times10^{17}$ cm$^{-3}$ and $1\times10^{19}$ cm$^{-3}$.

Although not shown, a further step is to ion implant the n-type doping region of the photodiode. Thus, using the same ion implantation mask as in the previous step, an ion implantation process is performed to implant dopant material of the second conductivity type, e.g., n-type dopant material, such as phosphorus, arsenic or antimony, to form the charge collection layer beneath the ion implanted p type pinning layer 180. The n-type dopant material is implanted at higher energy levels to form the n-type doped region 170 of the photodiode 100 as shown in the figures. The active n-type dopant material is ion implanted at dosing concentrations ranging between $1\times10^{16}$ cm$^{-3}$ and $1\times10^{18}$ cm$^{-3}$. Although not shown, the photosensitive charge storage region 170 for collecting photo-generated electrons may be formed by multiple implants to tailor the profile of the n-type region 170. It is understood that an implantation angled relative to the gate surface may be conducted to form the p pinning layer 180 and n– type region 170. It should be understood that, alternatively, the p pinning photodiode surface layer 180 may be formed by other known techniques and may be formed subsequent to or before forming the n charge collection layer. For example, the p surface layer 180 may be formed by a gas source plasma doping process, or by diffusing a p-type dopant from the in-situ doped layer or a doped oxide layer deposited over the area where photodiode 200 is to be formed.

In addition to the forming of the photodiode 200, an additional step of forming an n-type floating diffusion region at the other side of the transfer gate is performed. This step comprises forming a photoresist layer and patterning and etching an ion implantation mask according to techniques known in the art to form a mask edge approximately coincident with the gate edge or as close as possible given alignment tolerances, to provide an opening allowing the implantation of n-type dopant material, such as phosphorus, arsenic or antimony, at a concentration sufficient to form the n+ -type doped floating diffusion region 130 as shown in the figures up to the edge of the spacer 23b as shown in the structure depicted in FIG. 2. The active n+-type dopant material is ion implanted at the floating diffusion region at dosing concentrations ranging between $1\times10^{18}$ cm$^{-3}$ and $1\times10^{20}$ cm$^{-3}$.

There are several alternate embodiments to this invention that can add value to the basic idea shown and described with respect to FIG. 2. For instance, it should be understood that the present invention contemplates transfer gate recessed portions formation of varying shapes and sizes by a variety of known techniques. That is, the depth of the transfer gate is variable and, the width of the transfer gate with respect to the recess trench is variable. For example, in a first alternate embodiment, as shown in FIG. 4, a transfer gate 225 may be fabricated that includes a trench 227 etched significantly deeper than the transfer gate etch depth 116 according to the first embodiment (See FIG. 3(*b*)). That is, as shown in the first embodiment, the transfer gate etch depth 116 is required to be only slightly deeper than the p doped surface pinning layer 180 (which is typically about 0.1 lm deep). However, it may be beneficial to make the recess quite deep, e.g., to a depth ranging between about 0.3–1.0 lm with a preferred depth of about 0.5 lm–0.6 lm. If the recess is deeper than the n-type charge collection layer 170, then the resulting transfer gate channel length is independent of the overlay of the n charge collection well to the transfer gate. This may also help scaling by allowing a narrower transfer gate width since the total channel length will still be long. In a second alternate embodiment, as shown in FIG. 5, a transfer gate 325 may be fabricated that includes a "V" shaped trench recess portion 327 which, as known to skilled artisans, may be created by implementing a substrate wet etch process, e.g., that will stop on the <111> crystallographic plane which will provide about a 54.7 degree angle between the sidewall angle of the "V" and the surface, to form the "V" shaped trench recess which may be beneficial for surface state reduction as known in the art. In a further alternate embodiment, as shown in FIG. 6, a transfer gate 425 may be fabricated that is equal in width or narrower than the recess trench portion 427. In a further alternate embodiment, as shown in FIG. 7, a transfer gate 525 may be fabricated that includes an extended gate portion 526 overlapping the recess on the photodiode collection side. This is different than the first embodiment depicted in FIG. 2 wherein the transfer gate width is wider than the recess and overlaps on both sides of the gate. That is, as shown in FIG. 7, the transfer gate overlaps with the recess on the photodiode collection side.

Figure 8:
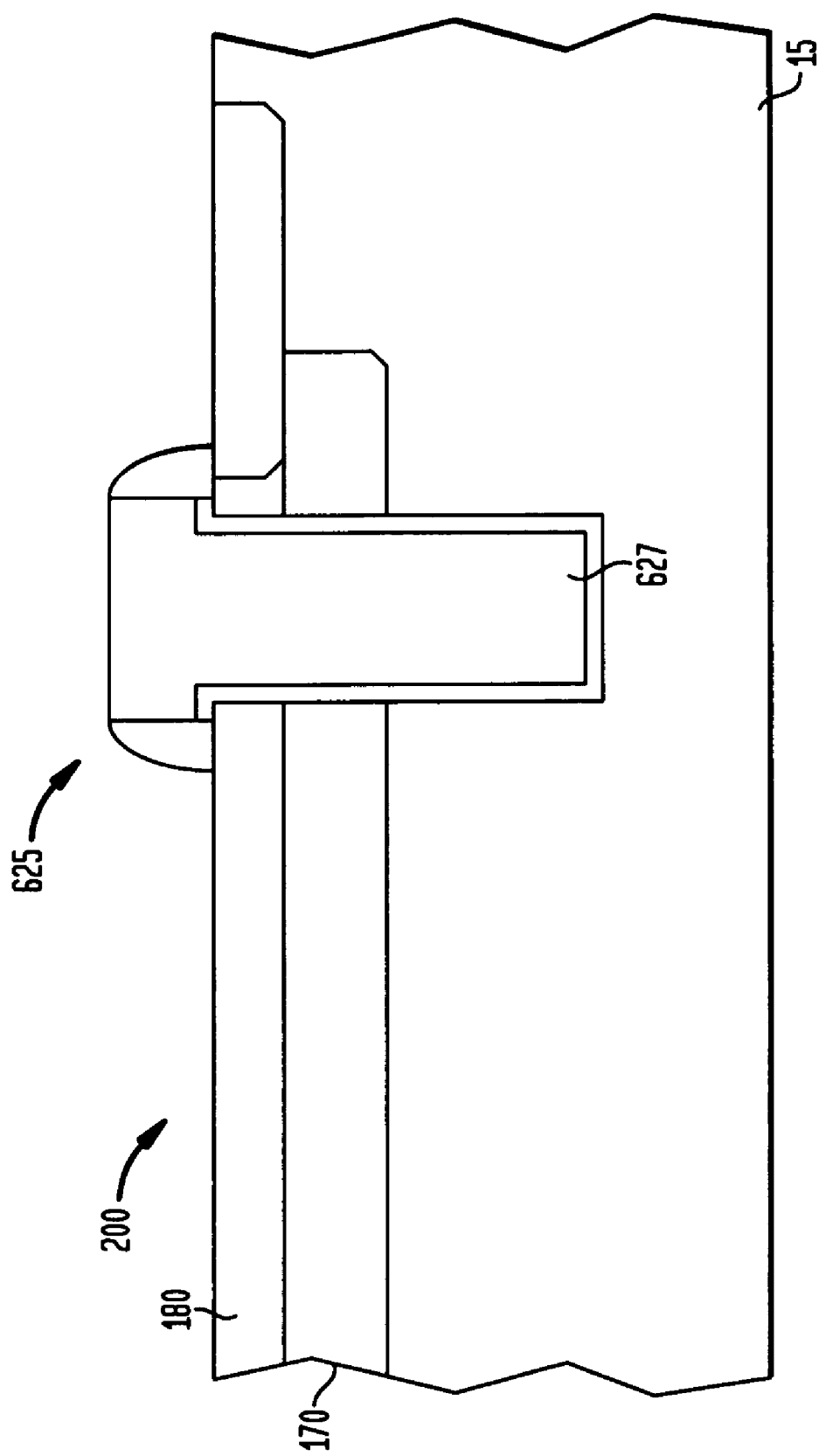

It is understood that, if the transfer gate is designed to be deep, the cell can be scaled aggressively. In the traditional cell layout, the p type surface pinning layer 180, the n-type charge collection well 180, and the n+ type diffusion region 130 all need to be lithographically aligned so that they do not cross the gate. This requirement forces a long transfer gate length. With a deep recess, however, all of these overlay tolerances can be eliminated by proper design. That is, the n-type charge collection well 170 would need to be designed to intentionally cross the transfer gate and would form the connection to the n+ drain contact. Overlay of this well 170 to the gate edge would not be critical. Further, although not shown, the p type surface pinning layer 180 may be formed to cross the transfer gate since it is no longer in the conducting path. The n+ diffusion region 130 would not be allowed to cross the gate, but because of the charge collection well 170, it would not need to abut the gate. The combination of these features allows for a much smaller cell such as shown in the further alternate embodiment as shown in FIG. 8, which depicts an APS cell including a transfer gate 625 having a smaller width than the previous embodiments, and, a deeper recessed gate portion 627 as the technology permits between about 0.3–1.0 lm. As further shown in FIG. 8, the n-type charge collection well 170 includes a region 172 intentionally crossing over the transfer gate 627 and forms a connection to the n+ type doped diffusion region 130, e.g., a drain contact.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An active pixel sensor (APS) cell structure comprising:
a substrate having an upper surface;
a gate comprising a dielectric layer formed on the substrate and a gate conductor formed on the gate dielectric layer;
a collection well layer of a first conductivity type formed below a surface of said substrate adjacent a first side of said gate conductor, a pinning layer of a second conductivity type formed atop the collection well at a surface of said substrate, said pinning layer and collection well layer forming part of a photodiode structure for said APS cell, and a diffusion region of a first conductivity type having at least a portion formed at said upper surface of said substrate and adjacent a second side of said gate conductor, said gate conductor forming a channel region enabling charge transfer between said collection well layer and said diffusion region,
wherein a portion of the gate conductor is recessed below the surface to a depth such that the bottom of the gate conductor us below the collection well.

2. The APS cell structure as claimed in claim 1 wherein a portion of the gate conductor is recessed below the surface to a depth at or below a bottom surface of said pinning layer.

3. The APS cell structure as claimed in claim 1 wherein a portion of the gate conductor is recessed below the surface to a depth such that the collection well layer intersects said channel region to thereby eliminate any potential barrier interference to charge transfer caused by said pinning layer.

4. The APS cell structure as claimed in claim 1 wherein the collection well layer includes a collection well layer portion adjacent said second side of said gate conductor overlapped by said diffusion region and forming a connection therewith.

5. The APS cell structure as claimed in claim 1 wherein said gate conductor is V-shaped.

6. The APS cell structure as claimed in claim 1 further comprising gate sidewall spacers formed at either side of the gate.

7. An active pixel sensor (APS) cell structure comprising:
a substrate having an upper surface;
a gate comprising a dielectric layer formed on the substrate and a gate conductor formed on the gate dielectric layer;
a collection well layer of a first conductivity type formed below a surface of said substrate adjacent a first side of said gate conductor, a pinning layer of a second conductivity type formed atop the collection well at a surface of said substrate, said pinning layer and collection well layer forming part of a photodiode structure for said APS cell, and a diffusion region of a first conductivity type having at least a portion formed at said upper surface of said substrate and adjacent a second side of said gate conductor, said gate conductor forming a channel region enabling charge transfer between said collection well layer and said diffusion region, wherein said gate conductor includes a first portion above said upper substrate surface and a second portion beneath said substrate surface, said first gate conductor portion having a width wider than said second gate conductor portion.

8. The APS cell structure as claimed in claim 7, wherein a portion of the gate conductor is recessed below the surface to a depth at or below a bottom surface of said pinning layer.

9. The APS cell structure as claimed in claim 7, wherein a portion of the gate conductor is recessed below the surface to a depth such that the collection well layer intersects said channel region to thereby eliminate any potential baffler interference to charge transfer caused by said pinning layer.

10. The APS cell structure as claimed in claim 7, wherein the collection well layer includes a collection well layer portion adjacent said second side of said gate conductor overlapped by said diffusion region and forming a connection therewith.

11. The APS cell structure as claimed in claim 7, further comprising gate sidewall spacers formed at either side of the gate.

12. The APS cell structure as claimed in claim 7, wherein said gate conductor is V-shaped.

13. An active pixel sensor (APS) cell structure comprising:
  a substrate having an upper surface;
  a gate comprising a dielectric layer formed on the substrate and a gate conductor formed on the gate dielectric layer;
  a collection well layer of a first conductivity type formed below a surface of said substrate adjacent a first side of said gate conductor, a pinning layer of a second conductivity type formed atop the collection well at a surface of said substrate, said pinning layer and collection well layer forming part of a photodiode structure for said APS cell, and a diffusion region of a first conductivity type having at least a portion formed at said upper surface of said substrate and adjacent a second side of said gate conductor, said gate conductor forming a channel region enabling charge transfer between said collection well layer and said diffusion region, wherein said gate conductor includes a first portion above said upper substrate surface and a second portion beneath said substrate surface, said first gate conductor portion having a width equal to or narrower than said second gate conductor portion.

14. The APS cell structure as claimed in claim 13 wherein a portion of the gate conductor is recessed below the surface to a depth at or below a bottom surface of said pinning layer.

15. The APS cell structure as claimed in claim 13 wherein a portion of the gate conductor is recessed below the surface to a depth such that the collection well layer intersects said channel region to thereby eliminate any potential barrier interference to charge transfer caused by said pinning layer.

16. The APS cell structure as claimed in claim 13 wherein the collection well layer includes a collection well layer portion adjacent said second side of said gate conductor overlapped by said diffusion region and forming a connection therewith.

17. The APS cell structure as claimed in claim 13 further comprising gate sidewall spacers formed at either side of the gate.

18. A CMOS image sensor including an array of pixels, each pixel including an active pixel sensor (APS) cell structure comprising:
  a substrate having an upper surface;
  a gate comprising a dielectric layer formed on the substrate and a gate conductor formed on the gate dielectric layer;
  a collection well layer of a first conductivity type formed below a surface of said substrate adjacent a first side of said gate conductor, a pinning layer of a second conductivity type formed atop the collection well at a surface of said substrate, said pinning layer and collection well layer forming part of a photodiode structure for said APS cell, and a diffusion region of a first conductivity type having at least a portion formed at said upper surface of said substrate and adjacent a second side of said gate conductor, said gate conductor forming a channel region enabling charge transfer between said collection well layer and said diffusion region, wherein a portion of the gate conductor is recessed below the surface to a depth such that the bottom of the gate conductor us below the collection well.

19. The CMOS image sensor as claimed in claim 18 wherein said gate conductor includes a first portion above said upper substrate surface and a second portion beneath said substrate surface, said first gate conductor portion having a width wider than said second gate conductor portion.

20. The CMOS image sensor as claimed in claim 18 wherein said gate conductor includes a first portion above said upper substrate surface and a second portion beneath said substrate surface, said first gate conductor portion having a width equal to or narrower than said second gate conductor portion.

* * * * *